(12) United States Patent
Raghuraman et al.

(10) Patent No.: US 10,727,836 B1
(45) Date of Patent: Jul. 28, 2020

(54) TRISTATE AND PASS-GATE BASED CIRCUIT WITH FULL SCAN COVERAGE

(71) Applicant: Intel Corporation, Santa Clara, CA (US)

(72) Inventors: Eashwar Raghuraman, Bangalore (IN); Satish Sethuraman, Banagalore (IN); Edward Brazil, Leixlip (IE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/404,616

(22) Filed: May 6, 2019

(51) Int. Cl.
*H03K 19/173* (2006.01)
*H03K 17/693* (2006.01)

(52) U.S. Cl.
CPC ....... *H03K 19/1737* (2013.01); *H03K 17/693* (2013.01)

(58) Field of Classification Search
CPC .................. H03K 19/1737; H03K 17/693
USPC ........................................................ 326/113
See application file for complete search history.

(56) References Cited

U.S. PATENT DOCUMENTS

| 7,439,774 | B2* | 10/2008 | Jung | H03K 17/005 |
| | | | | 326/113 |
| 8,487,657 | B1* | 7/2013 | Hoekstra | H03K 19/0963 |
| | | | | 326/112 |
| 2008/0303553 | A1* | 12/2008 | Chiang | H03K 17/005 |
| | | | | 326/113 |

OTHER PUBLICATIONS

Wohl, Peter et al., "Testing 'Untestable' Faults in Three-State Circuits", 14th VLSI Test Symposium, 1996, 8 pgs.

* cited by examiner

*Primary Examiner* — Daniel D Chang
(74) *Attorney, Agent, or Firm* — Green, Howard & Mughal LLP

(57) ABSTRACT

A tristate and pass-gate based multiplexer circuit structure is described with full scan coverage capability. The circuit provides deterministic state at its output avoiding high impedance (Z) logic states in silicon. This is realized using a pull-up transistors, pull-down transistors, or through stages of combinational logic combining the multiplexer selects/enables feeding a pull-up or pull-down transistors.

17 Claims, 12 Drawing Sheets

TRISTATE AND PASS-GATE BASED CIRCUIT WITH FULL SCAN COVERAGE

BACKGROUND

Pass-gate multiplexers are widely used in high-speed processors. Undetected faults on pins (or nodes) of certain circuits can cause computational errors. The faults at the select pins (or nodes) of such circuits can cause high-impedance (Z) output states, which cannot be detected using a tester. Undetected faults on pins (or nodes) of such circuits can prevent us from distinguishing good chips from faulty chips. It is desirable to detect all faults in circuits to meet ultra-low defective parts per million rates (DPM), typically less than 50, for example, for circuit in automotive industry. Due to large-scale usage of the pass-gate multiplexer's in high-speed circuits, coverage loss due to these undetected faults is large and must be solved to meet the ultra-low defective parts per million rates (DPM) criteria.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
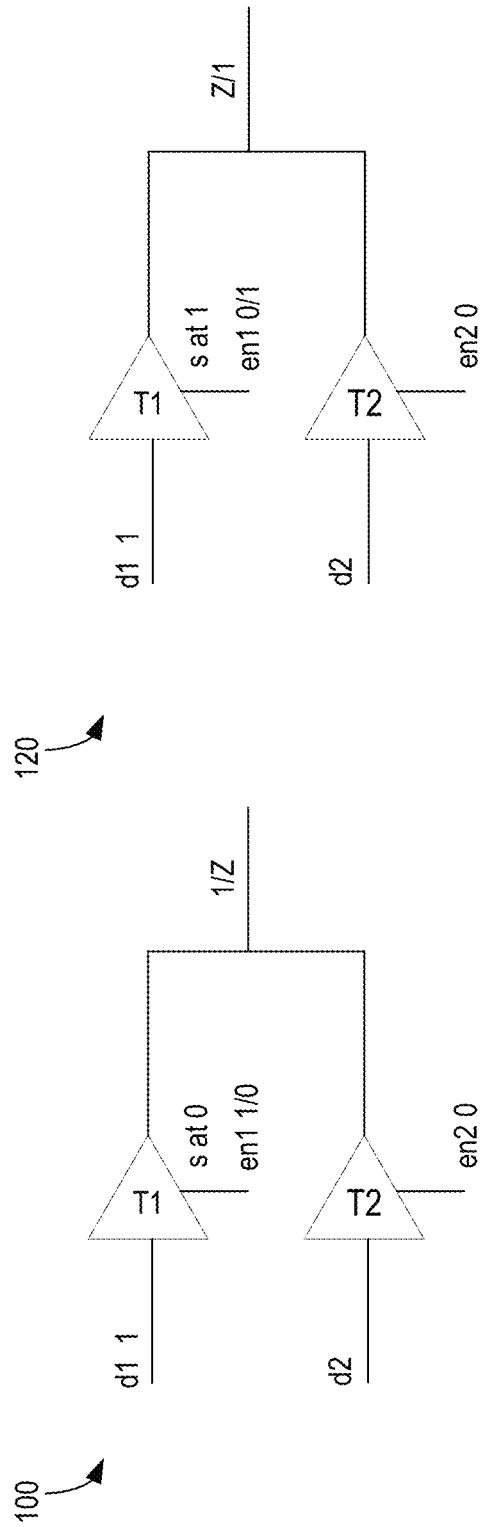
FIGS. 1A-B illustrate circuits that show high-impedance output state due to logic being stuck at zero or one.

Some embodiments describe a novel tristate or pass-gate based multiplexer circuit structure (or a combination of both) with full scan coverage capability. The circuit provides deterministic state at its output avoiding high-impedance (Z) logic states in silicon. The circuit can be realized using a pull-up transistors, pull-down transistors, or through stages of combinational logic combining the multiplexer selects and/or enables feeding a pull-up or pull-down circuit.

The embodiments described herein provide the ability to significantly boost or improve test coverage on processors and other high-speed intellectual property (IP) blocks which are ubiquitous in the today's system-on-chip (SOC) portfolio. This test coverage boost is invaluable because it improves the outgoing product quality to customers by increasing the defect screening capability in manufacturing. This capability is critical for new process generations of varying maturity. The embodiments also provide improved in-field hardware diagnostic coverage, and therefore improved functional safety (FuSa) capability. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIGS. 1A-B illustrate circuits 100 and 120, respectively, that show high impedance output state due to enable being stuck at zero or one. Circuit 100 (and circuit 120) is shown to have two tristate drivers T1 and T2 (or multiplexers T1 and T2) that are controlled by select or enable signals en1 and en2, respectively. Input to driver T1 is d1, while input to driver T2 is d2. The outputs of the two drivers T1 and T2 are merged to a single output node.

The problem arises in pass gate and tristate mux circuits (T1 and/or T2), when the presence of a defect causing a stuck-at zero (FIG. 1A) or stuck-at one fault (FIG. 1B), the output of the cell resolves to Z (high impedance) or a contention state. Both of these states are unknown values and cannot be used to detect a fault. For logic faults to be robustly detected, for example, by structural test using a Scan ATPG (automatic test pattern generation) tool, the output of the cell under test must resolve to a deterministic one or zero in the presence of a defect. The un-deterministic state at the output leads to loss in fault coverage across the logic cone driving the select. One solution is to use a p-type pull-up transistor at the output node to resolve the Z state creating a distinguishable difference between good machine and fault machine values. The gate G of the restore p-type transistor is controlled such that the Z is resolved to a 1 on a tristate bus by scan mode. Another solution is to use a simulation based approach to detect faults on the select lines, for example, assuming the bus net would remain a particular value from a previous clock cycle instead of a Z.

There are disadvantages of the p-type pull-up solution. For example, the contention between the functional mode testing and the weak pull-up p-type transistor causes an increase in scan power and issues in output voltage values due to the contention. This contention minimizes their effectiveness in designs, which are used in field scan, where the design would be under scan for a considerable time. The contention leads to unwanted short circuit power dissipation through the restore p-type transistor during the scan modes leading to scan power increase, noise, and reliability issues. This implementation that results in contention also may not be used during testing at speed as the cell delay is increased substantially during scan test due to contention between the pull-up and the functional cell.

Simulation based approaches have the disadvantage that there is no guaranteed keeper of the output bus value. Leakage, noise, local process variation, and glitches can all invalidate the assumptions of simulations and probability. It is important that fault effects are robustly resolved to discrete logic values in order to be considered detected.

Various embodiments describe a circuit, which provides deterministic state during the possible states of Hi-Z (high impedance) which reduce scan coverage. This is realized using a pull-up, pull-down or through stages of combinational logic combining the enables feeding a pull-up or pull-down circuit.

Figure 2:
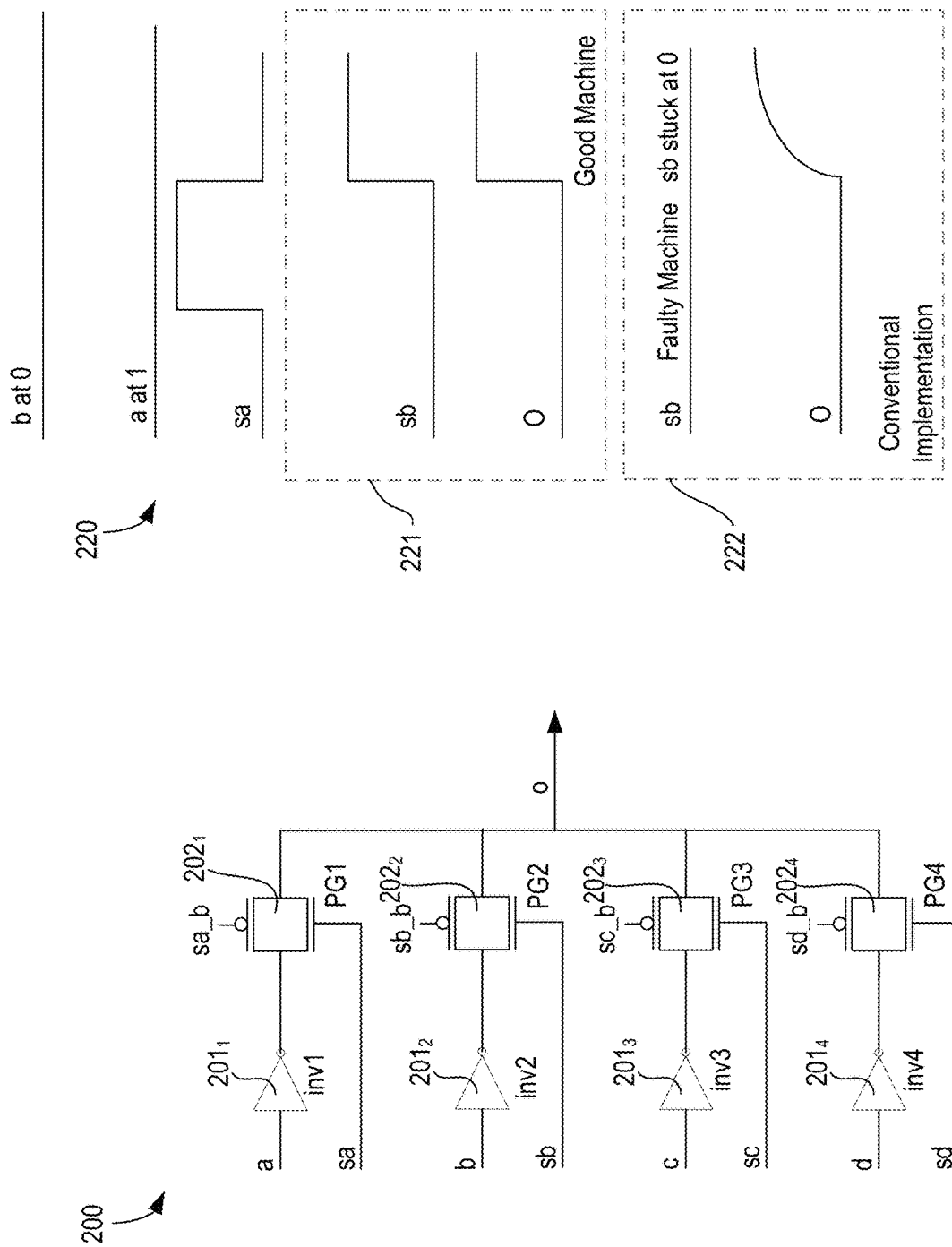
FIGS. 2A-B illustrate a 4:1 multiplexer and associated timing diagram, respectively.

FIGS. 2A-B illustrate a 4:1 non-decoded multiplexer (MUX) 200 and associated timing diagram 220, respectively, suffering from fault coverage loss. Multiplexer 200 includes input nodes a, b c, and d; pass-gate control nodes, sa, sa_b, sb_b, sc, sc_b, sd, and sd_b, inverters $201_{1-4}$ (also labeled as inv1 though inv4), and pass-gates (PG) $202_{1-4}$ (also labeled as PG1 though PG4). Here, labels for nodes and signals on those nodes are interchangeably used. For example. Node a carries signal a. Also, the suffix "_b" indicates an inversion. For example, sa_b is an inverted signal of sa.

FIG. 2A shows an undecoded 4:1 Pass Gate (PG) based Multiplexer with possible test scenario to illustrate the problem. When select sb is 1, the output follows the input data b as indicated by waveform 221. When select sb is stuck at 0, the output of the MUX is not controlled and is floating due to the mutex (mutually exclusive) nature of the other select signals. The output 'o', which is supposed to be stable at "0", can potentially drift towards "1" due to leakage and noise as indicated by waveforms 222. This non-deterministic state leads to fault coverage loss across the logic cone of the select signal.

Figure 3:
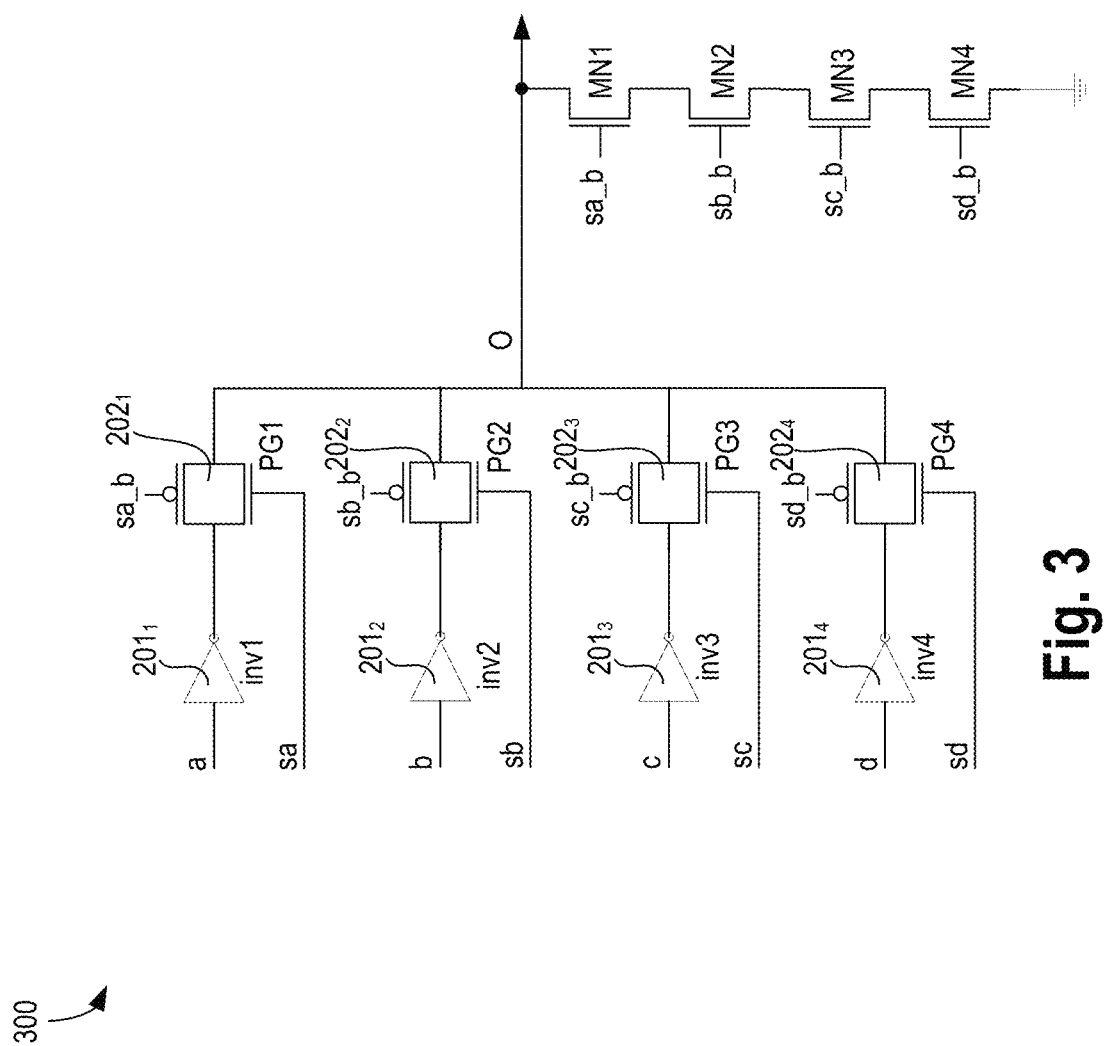
FIG. 3 illustrates a 4:1 multiplexer circuitry, in accordance with some embodiments.

FIG. 3 illustrates circuitry (Mux) 300 in accordance with some embodiments. FIG. 3 shows the proposed circuit with fault coverage capability. Mux 300 is similar to Mux 200 but for an additional pull-down network controlled by the select signals of the multiplexer creating a deterministic output 'O' when none of the PGs are controlling the output. The pull-down network in this example comprises n-type transistors MN1, MN2, MN3, and MN4 coupled together in series such that transistor MN1 is coupled to output 'O' and transistor MN4 is coupled to ground (Vss). The gate of transistor MN1 is controlled by sa_b, the gate of transistor MN2 is controlled by sb_b, the gate of transistor MN3 is controlled by sc_b, and the gate of transistor MN4 is controlled by sd_b. While Mux 300 is illustrated as a 4:1 mux, the various embodiments are applicable to any multiplexer size (e.g., 5:1 mux, 6:1 mux, etc.). The pull-down network meets the noise and leakage constraints providing a strong "0" at the output. As such, full fault coverage capability is provided.

Figures 4A, 4B:
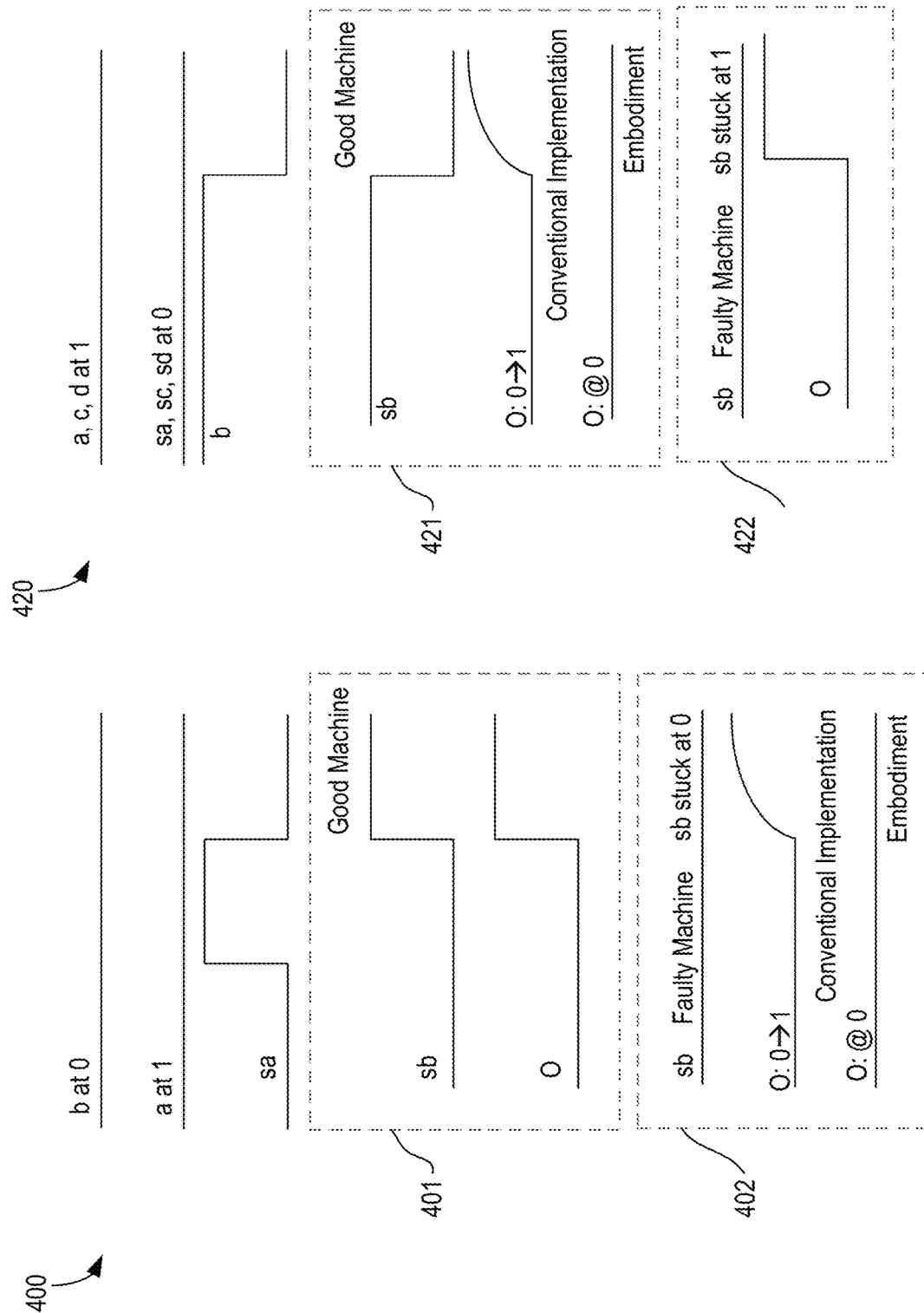
FIGS. 4A-B illustrate timing diagram for circuit of FIG. 3 showing struck at zero coverage, and stuck at one coverage, respectively, in accordance with some embodiments.

FIGS. 4A-B illustrate timing diagrams 400 and 420, respectively, for circuit of FIG. 3 showing struck at zero coverage, and stuck at one coverage, respectively, in accordance with some embodiments. FIG. 4A shows that when the select sb is stuck at '0', the output 'O' is at a deterministic state enabling the scan patterns to differentiate between a Good Machine (waveforms 401) and a Faulty Machine (waveforms 402). The circuit of FIG. 3 can also be used to identify stuck at "1" faults by driving all the select signals to zero as shown in FIG. 4B. In a good machine (waveforms 421) with the proposed circuit 300, the output is at a deterministic state of '0' irrespective of input data b. In a faulty machine (waveform 422), with the select sb being stuck at 1, the output 'O' will follow the input data b, allowing ATPG to differentiate between good and faulty machine. The circuit of various embodiments provides 100% fault coverage.

Figure 5A:
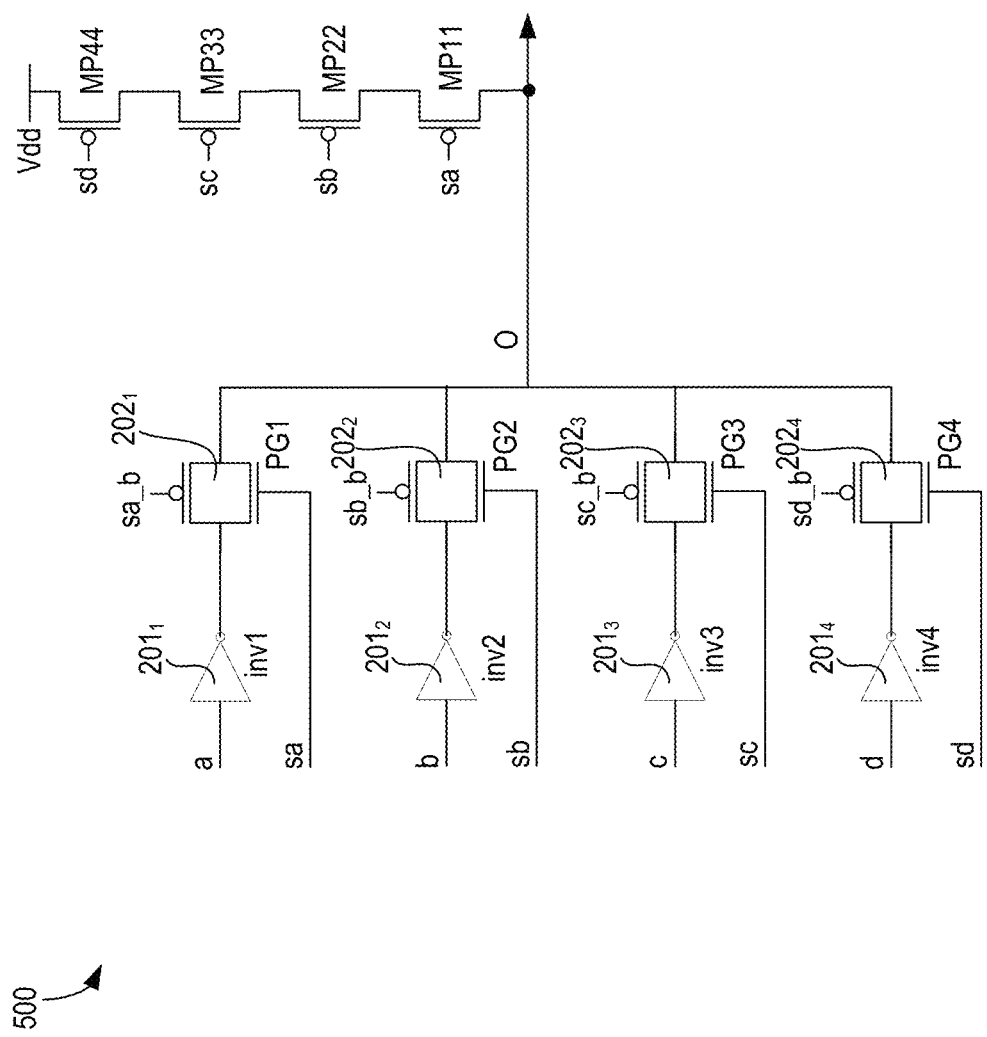
FIG. 5A-C illustrate pass-gate multiplexers, in accordance with some embodiments.
Figure 5B:
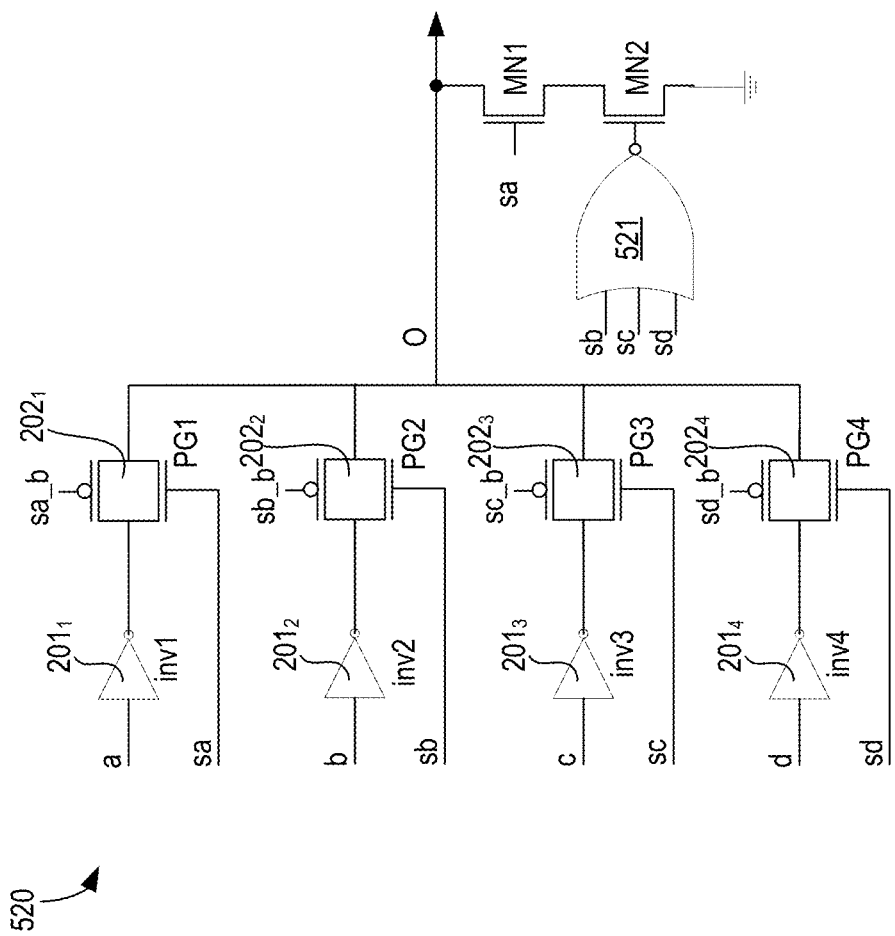
Figure 5C:
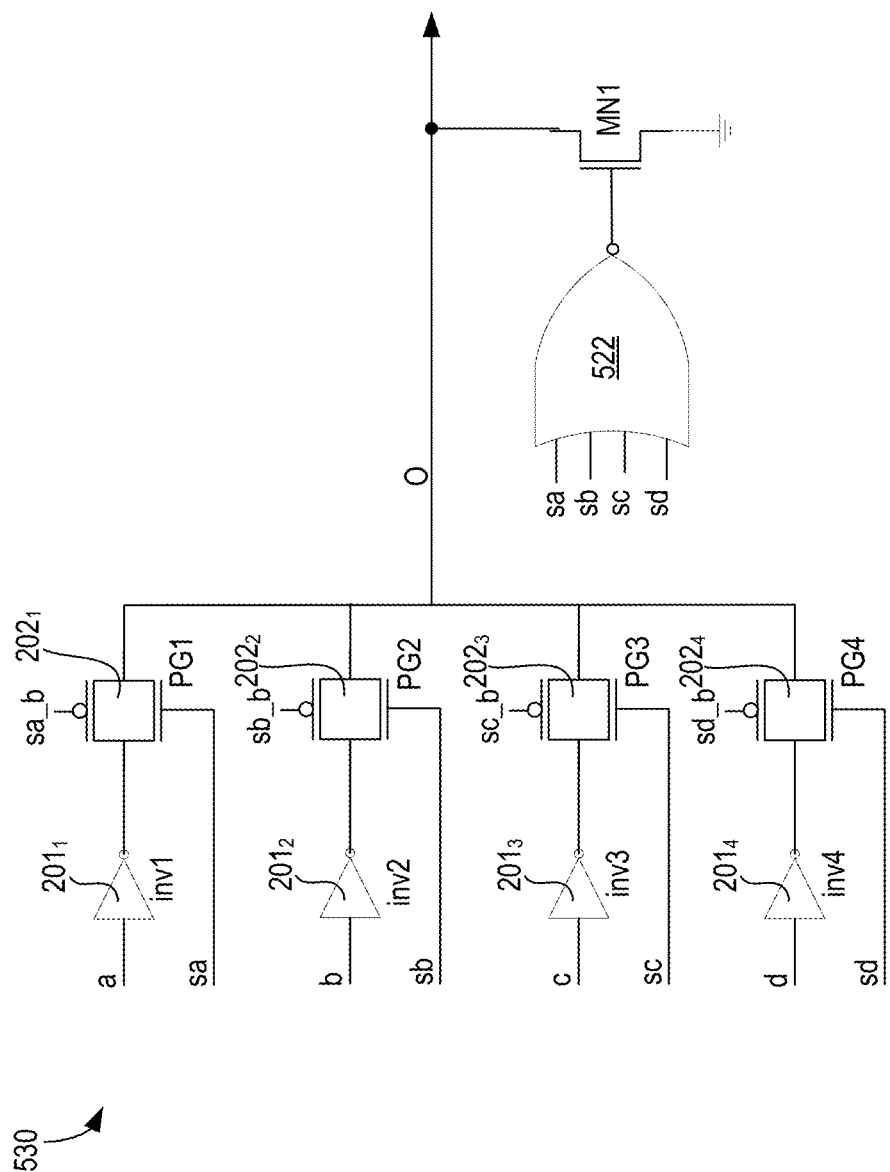

FIGS. 5A-C illustrate pass-gate multiplexers 500, 520, and 530, respectively, in accordance with some embodiments. The circuits of FIGS. 5A-C show alternate ways of implementation using the same concept are as shown in FIG. 3. The circuits are implemented with pull-up or pull-down network or by feeding an output of combinational logic combining the select signals to the pull-up or pull-down network. Choosing the right configuration among the options and sizing them is a design tradeoff between the library stack limit, input noise constraints to the MUX's, timing impact on the data and the select. The same technique can be used for tristate logic by adding a pull-down/pull-up transistor controlled by the tristate enables.

FIG. 5A is similar to FIG. 3 but for replacing the pull-down network with a pull-up network. In some embodiments, the pull-up network of mux 500 comprises p-type transistors MP11, MP22, MP33, and MP44 coupled together in series such that transistor MP11 is coupled to output 'O' and transistor MP44 is coupled to supply node (Vdd). The gate of transistor MP11 is controlled by sa, the gate of transistor MP22 is controlled by sb, the gate of transistor MP33 is controlled by sc, and the gate of transistor MP44 is controlled by sd. While Mux 500 is illustrated as a 4:1 mux, the various embodiments are applicable to any multiplexer size (e.g., 3:1, 5:1 mux, 6:1 mux, etc.).

FIG. 5B is similar to FIG. 3 but for replacing the pull-down network with combinational logic controlled pull-down network. The pull-down network of FIG. 5B comprises n-type transistor MN1, n-type transistor MN2, and NOR gate 521. The gate of MN1 is controlled by sa, which the gate of transistor MN2 is controlled by the output of NOR gate 521. The inputs of NOR gate 521 are sb, sc, and sd. While Mux 520 is illustrated as a 4:1 mux, the various embodiments are applicable to any multiplexer size (e.g., 3:1, 5:1 mux, 6:1 mux, etc.). With a large multiplexer (e.g., more input signals), a large NOR gate (e.g., with more inputs) can be used.

FIG. 5C is similar to FIG. 5B but for replacing the pull-down network with one transistor and combinational logic that controls that transistor. In this example, the pull-down network of mux 530 comprises n-type transistor MN1 coupled to output node 'O' and ground. The gate of transistor MN1 is controlled by a 4-input NOR gate 522 for a 4-input Mux. The inputs to NOR gate 522 are sa, sb, sc, and sd. A person skilled in the art would appreciate that the pull-up network can comprise p-type devices and the polarity of signals controlling the gates of those p-type devices can be adjusted appropriately to achieve the same function as all n-type transistors. To that end, the pull-down network may also comprise p-type transistors instead and/or in addition to n-type transistors, and the polarity of signals controlling the gates of those p-type devices can be adjusted appropriately to achieve the same function as all n-type transistors. In some embodiments, the combinational logic such as NOR gates 521 and 522 can be replaced with other suitable logic such as NAND gates, and the polarity of signals controlling the gates of those p-type devices can be adjusted appropriately to achieve the same function.

Sizing the pull-down network optimally minimizes the impact on area, timing and power on the functional circuit. Consider the case where the driving inverters and pass-gates (PGs), INV1 and PG1 in FIG. 3, are sized to 16 times the minimum allowed width of the transistors (e.g., 16 Diffusion Grid (DG)). The output load cap can potentially reach cmax (maximum capacitance the library cell can drive) of the library cell. This would require to size the pull-down stack at least to the size of INV1 (e.g., bigger for stacked pull-down configurations) to enable speed scan tests. This leads to significant area impact for each multiplexer (MUX), which cumulates across the IP or SOC. The problem is compounded with the higher impact on the functional timing arc due to the output cap increase coming from the diffusions of the large pull down network.

To reduce the size of the pull-down network, the scan patterns are ordered such that the output node is already discharged through the pass-gate (PG1) using the driving inverters (INV1). Thus the function of the pull-down network is similar to that of a keeper to meet the noise and leakage constraints. As such, the pull-down/pull-up network can be sized to the minimum width allowed by the process technology. This technique minimizes the impact of the area, timing and power on the functional circuit.

The above automatic test matter generation (ATPG) re-ordering enables the pull-down transistors to be sized to minimum allowed width in the process (1 DG) technology. Thus, the area cost of adding the pull-down network is may be limited. In one example, the area increase at the library cell level is 3 Poly-Pitch for a 3:1 Multiplexer and 5 Poly-Pitch for a 4:1 Multiplexer across all the drive strengths of the mux.

The timing cost on the data pin in the circuit of some embodiments is due to the additional diffusion capacitance of the pull-down transistors at the output which need to charged/discharged by the driving inverter (Ex: INV1). In the select pin, the timing cost is due to the gate capacitance of the pull-down transistors & the additional diffusion cap at the output pin.

Figure 6:
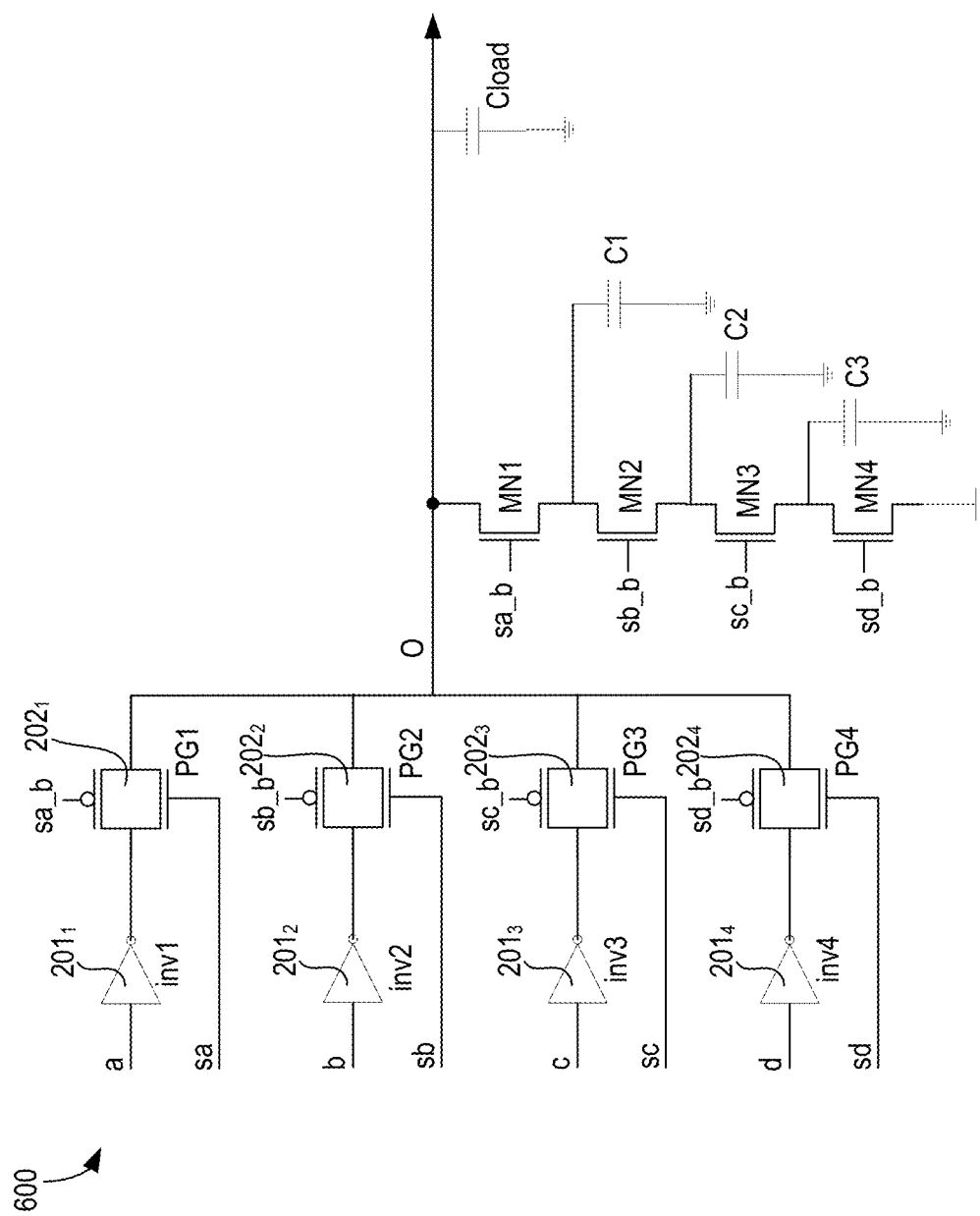
FIG. 6 illustrates a non-decoded pass-gate based multiplexer with additional diffusion capacitance, in accordance with some embodiments.

FIG. 6 illustrates a non-decoded pass-gate based multiplexer 600 with additional diffusion capacitance, in accordance with some embodiments. Mux 600 is same as Mux 300 but with diffusion capacitances C1, C2, and C3. Cload represents the load capacitance on the output node 'O'. In the 4-input non-decoded MUX 600, three n-type transistors in the pull-down stack are turned on at any point of time due to the mutex (mutually exclusive) nature of the select signals. The worst case timing impact on select and/or data pin in functional mode will be to the sd/d pin of the MUX. This is due to the fact that when the select sd is selected, other selects sa, sb, and sc are "0", exposing the diffusion cap of top 3 pull-down transistors to the output. The next worse impacted pairs will be sc/c followed by sb/b and sa/a. This impact is minimized by reducing the size of the pull-down stack and the additional capacitance.

While muxes of various embodiments with full scan coverage are illustrated as pass-gate based muxes, the pass-gates can be replaced with tri-statable devices without changing the essence of the embodiments. The tri-statable buffers can be enabled or disabled using the same signals as used to control the pass-gates.

Figure 7A:
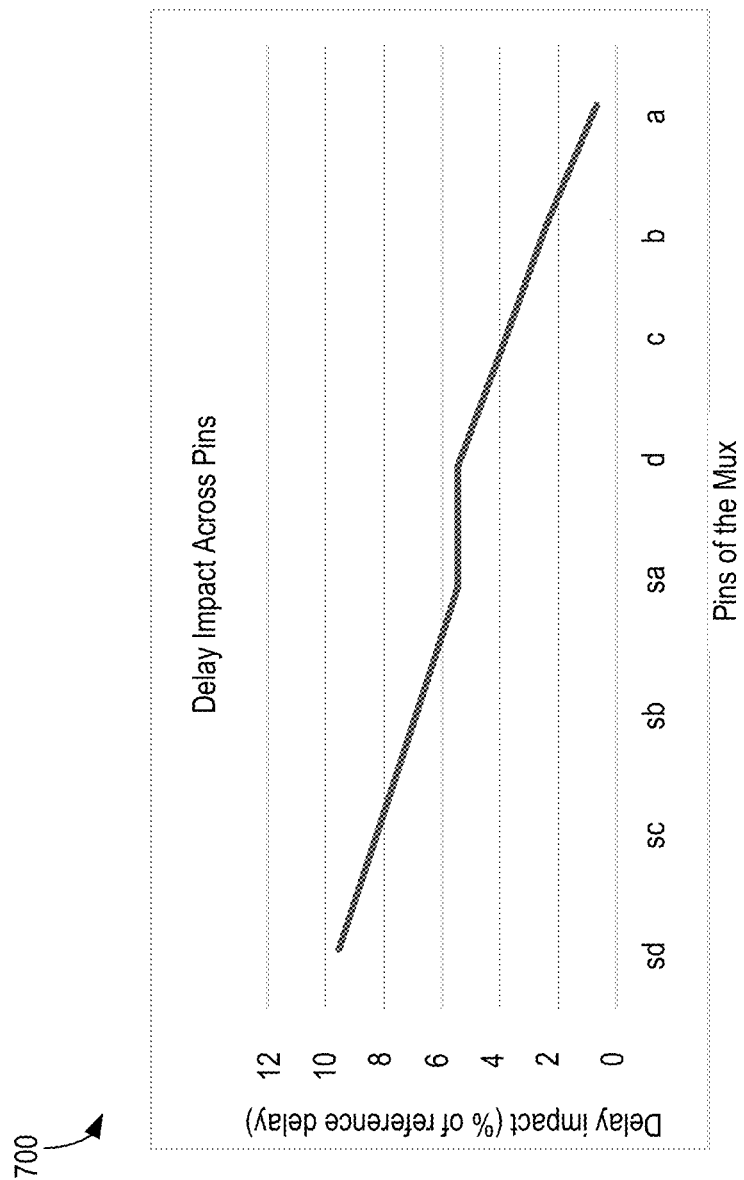
FIGS. 7A-B illustrate plots showing delay impact across pins and delay impact vs. multiplexer drive strength.
Figure 7B:
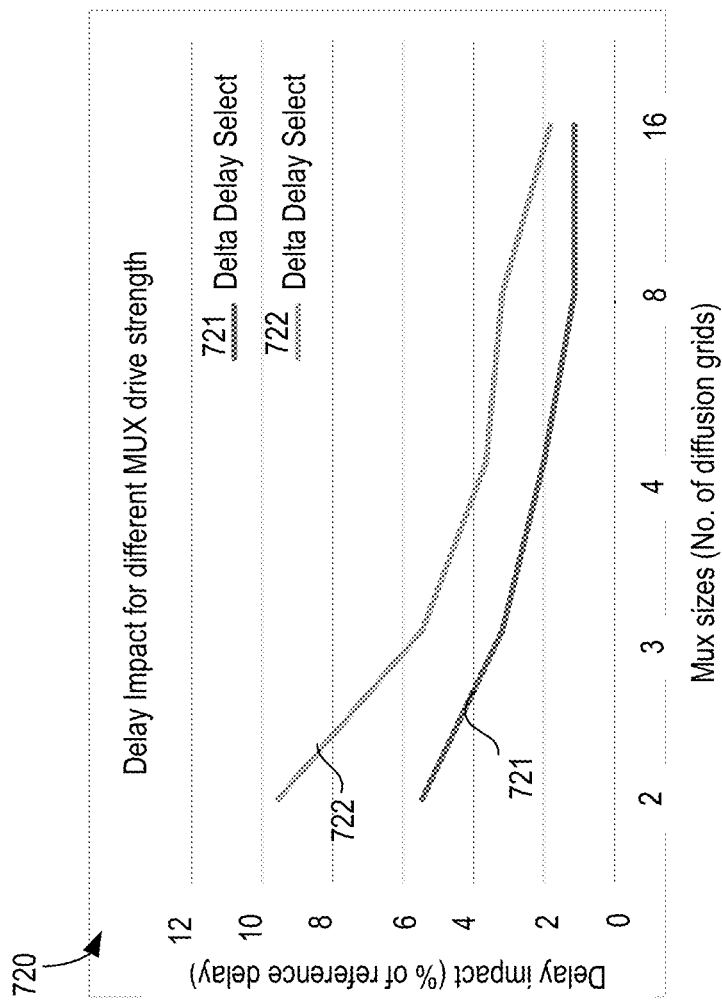

FIGS. 7A-B illustrate plots 700 and 720, respectively, showing delay impact across pins and delay impact versus multiplexer drive strength. Plot 700 shows the timing impact in terms of delay increase for different arcs for a 4:1 mux of smallest drive strength (2 DG) available in the library. The pull-down transistors are sized to minimum size (1 DG). The delay impact is lesser for the other subsequent pins as discussed herein.

As the drive strength of the multiplexer increases, the delay impact due to the additional pull-down network becomes negligible. Plot 720 shows the delay impact on the select pin sd (waveform 721) and data pin d (waveform 722) or different drive strengths/Diffusion Grid (DG) of the mux. The reference delay is maintained to be same as the above setup. The reduction of delay impact with Mux drive strength increase is attributed to the large inverter of MUX driving the small diffusion cap of the pull down network.

The power impact is limited to the additional capacitance due to the pull-down network. The impact is largely minimal due to the minimum size of the pull-down network.

Figure 8:
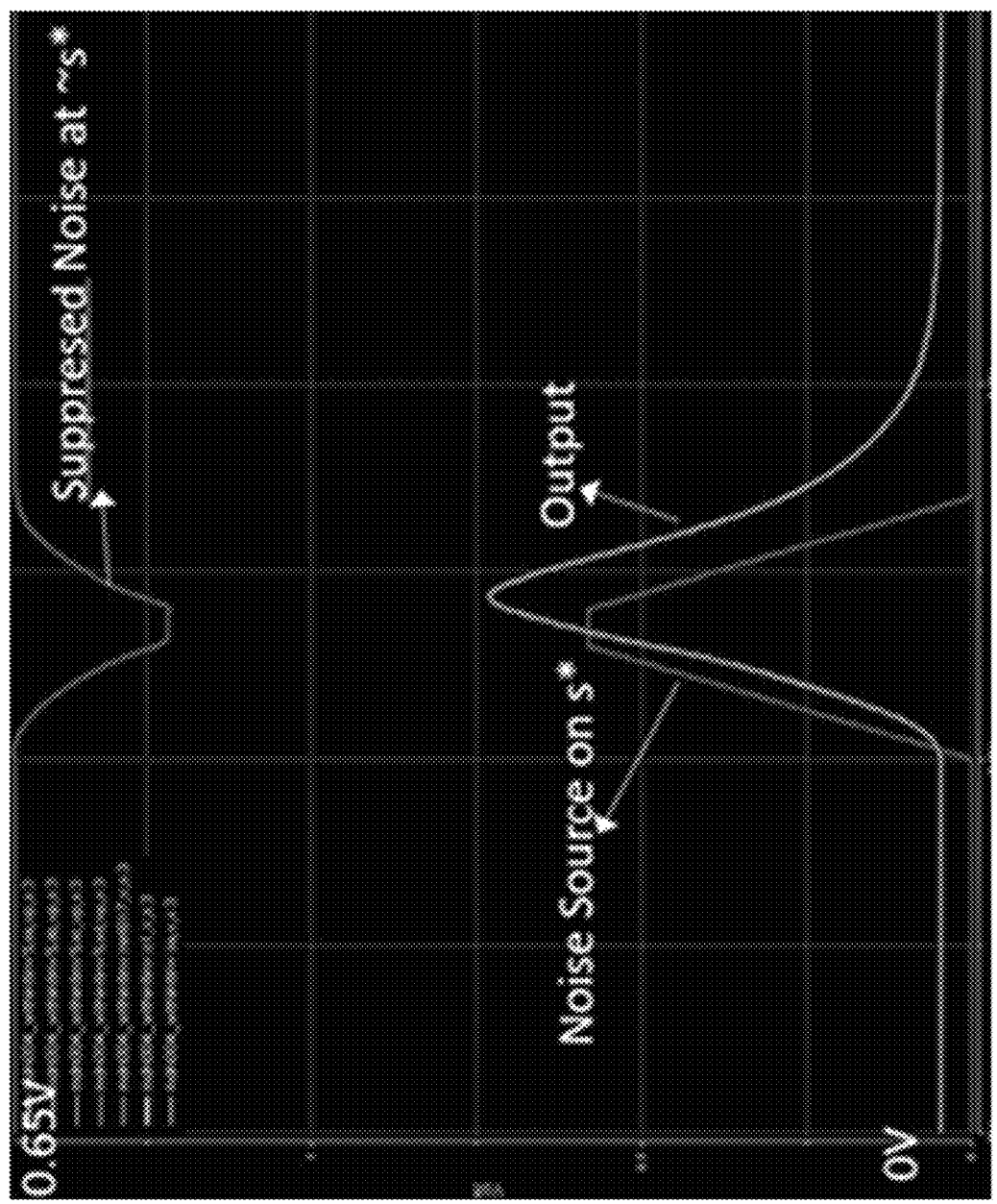
FIG. 8 illustrates a plot showing noise source at the select input and the response at the output.

FIG. 8 illustrates plot 800 showing noise source at the select input and the response at the output. The pull-down stack is sized to minimum size allowed by the technology node (1DG). The circuit is kept in the keeper mode with the pull-down network keeping "0" at the output. The circuit is found to meet the required noise constraint of 50% of VDD, even with a pessimistic noise input of 30% of VDD at the select inputs (acting simultaneously) and the data inputs configured to drive 1 at the output. Since the pull-down network is connected through the internal inverter, the inverter shields the noise of the external select signal enabling the output node to recover to the original state. Plot 800 shows the noise source on all the selects s*, suppressed noise on s*_b and the output nodes' response to the noise.

Figure 9:
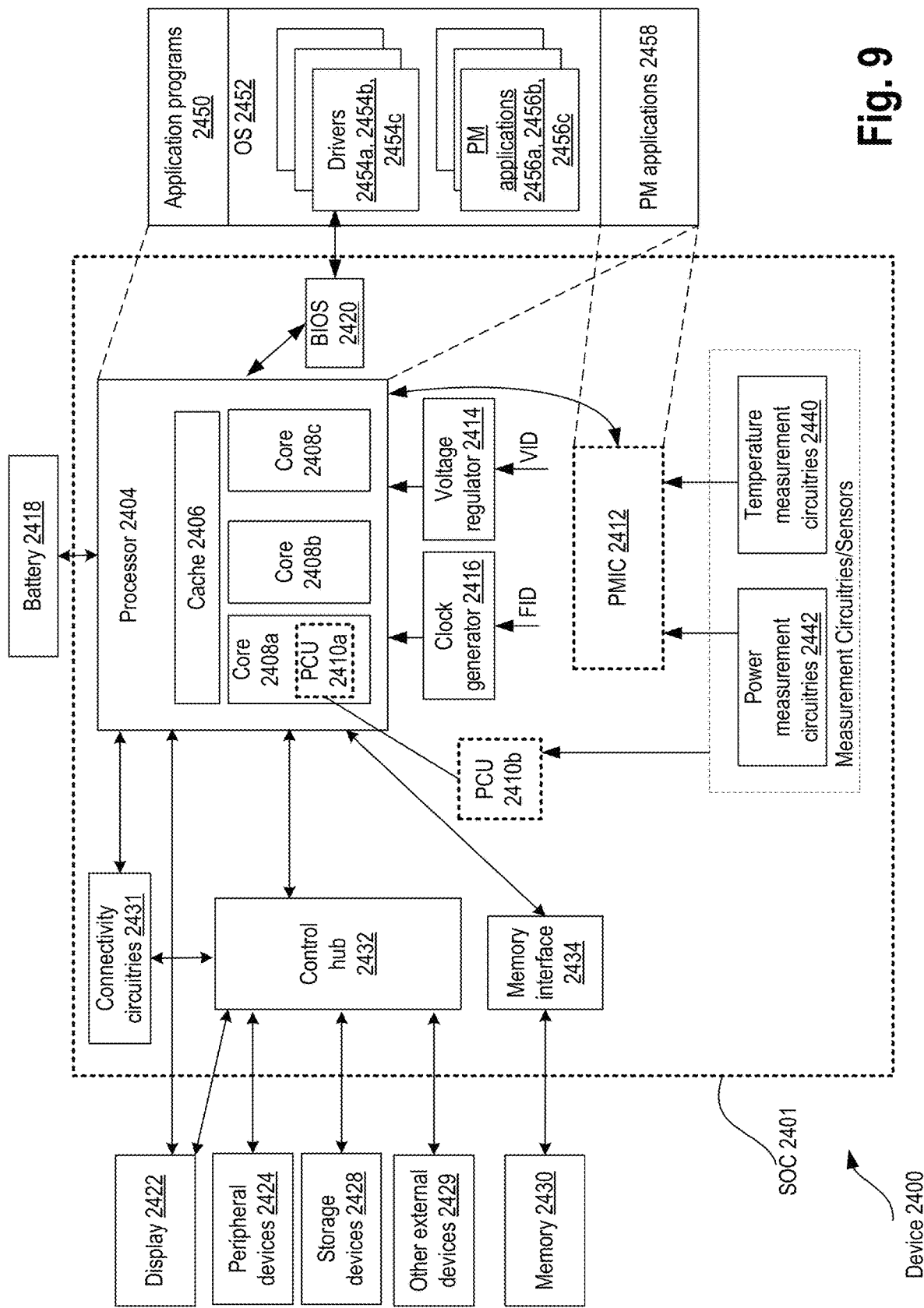
FIG. 9 illustrates a smart device or a computer system or a SoC (System-on-Chip) having tri-gate and pass-gate based circuit with full scan coverage, according to some embodiments of the disclosure.

FIG. 9 illustrates a smart device, or a computer system, or a SoC (System-on-Chip) having tri-gate and pass-gate based circuit with full scan coverage, according to some embodiments of the disclosure. In some embodiments, computing device 2400 represents a mobile computing device, such as a computing tablet, a mobile phone or smart-phone, a wireless-enabled e-reader, or other wireless mobile device. It will be understood that certain components are shown generally, and not all components of such a device are shown in computing device 2400. Any of the blocks herein can have the tri-gate and pass-gate based circuit with full scan coverage.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 9, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 1, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410a/b and/or PMIC 2412. In some embodiments, each core has a network of distributed LDOs to provide efficient control for power management. The LDOs can be digital, analog, or a combination of digital or analog LDOs.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporarily for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The embodiments are described with reference to various examples. These examples can be combined with other examples in any suitable manner.

Example 1

An apparatus comprising: a first pass-gate controllable by first and second signals, wherein the second signal is a complementary of the first signal; a second pass-gate controllable by third and fourth signals, wherein the fourth signal is a complementary of the third signal; a third pass-gate controllable by fifth and sixth signals, wherein the sixth signal is a complementary of the fifth signal, wherein the first, second, and third pass-gates are coupled to a node; and a network of devices coupled to the node, wherein the network of devices is controllable by at least three of: first, second, third, fourth, fifth, or sixth signals.

Example 2

The apparatus of example 1, wherein the network of devices comprises a pull-down network coupled to the node and ground.

Example 3

The apparatus of example 2, wherein the pull-down network comprises at least three transistors coupled in series between node and the ground.

Example 4

The apparatus of claim example 3, wherein the three transistors are n-type transistors.

Example 5

The apparatus of claim example 1, wherein the network of devices comprises a pull-up network coupled to the node and a supply node.

Example 6

The apparatus of example 5, wherein the pull-up network comprises at least three transistors coupled in series between node and the supply node.

Example 7

The apparatus of example 6, wherein the three transistors are p-type transistors.

Example 8

The apparatus of example 1, wherein the network of devices comprises: a transistor coupled to the node and ground; and a combinational logic gate coupled to a gate of the transistor.

Example 9

The apparatus of example 1, wherein the network of devices comprises: a first transistor coupled to the node; a second transistor coupled in series with the first transistor; and a combinational logic gate coupled to a gate of the first or second transistor.

Example 10

The apparatus of example 1 comprises: a first inverter coupled to the first pass-gate, wherein the first inverter is to be driven by a first input signal; a second inverter coupled to the second pass-gate, wherein the second inverter is to be driven by a second input signal; a third inverter coupled to the third pass-gate, wherein the third inverter is to be driven by a third input; and a fourth inverter coupled to the third pass-gate, wherein the fourth inverter is to be driven by a fourth input.

Example 11

An apparatus comprising: a first tri-stable buffer or inverter controllable by first and second signals, wherein the second signal is a complementary of the first signal; a second tri-stable buffer or inverter controllable by third and fourth signals, wherein the fourth signal is a complementary of the third signal; a third tri-stable buffer or inverter controllable by fifth and sixth signals, wherein the sixth signal is a complementary of the fifth signal, wherein the first, second, and third tri-stable buffers or inverters are coupled to a node; and a network of devices coupled to the node, wherein the network of devices is controllable by at least three of: first, second, third, fourth, fifth, or sixth signals.

Example 12

The apparatus of example 11, wherein the network of devices comprises a pull-down network coupled to the node and ground.

Example 13

The apparatus of example 12, wherein the pull-down network comprises at least three transistors coupled in series between node and the ground.

Example 14

The apparatus of example 13, wherein the three transistors are n-type transistors.

Example 15

The apparatus of example 11, wherein the network of devices comprises a pull-up network coupled to the node and a supply node.

Example 16

The apparatus of example 15, wherein the pull-up network comprises at least three transistors coupled in series between node and the supply node.

Example 17

The apparatus of example 16, wherein the three transistors are p-type transistors.

Example 18

The apparatus of example 11, wherein the network of devices comprises: a transistor coupled to the node and ground; and a combinational logic gate coupled to a gate of the transistor.

Example 19

The apparatus of example 11, wherein the network of devices comprises: a first transistor coupled to the node; a second transistor coupled in series with the first transistor; and a combinational logic gate coupled to a gate of the second transistor.

Example 20

A system comprising: a memory; and a processor coupled to the memory, wherein the processor includes a multiplexer which includes: a first pass-gate controllable by first and second signals, wherein the second signal is a complementary of the first signal; a second pass-gate controllable by third and fourth signals, wherein the fourth signal is a complementary of the third signal; a third pass-gate controllable by fifth and sixth signals, wherein the sixth signal is a complementary of the fifth signal, wherein the first, second, and third pass-gates are coupled to a node; and a network of devices coupled to the node, wherein the network of devices is controllable by at least three of: first, second, third, fourth, fifth, or sixth signals; and a wireless interface communicatively coupled to the processor.

Example 21

The system of example 20, wherein the network of devices comprises one of: a pull-down network coupled to the node and ground; or a pull-up network coupled o the node and a power supply node.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    a first pass-gate controllable by first and second signals, wherein the second signal is a complementary of the first signal, and wherein an n-type transistor of the first pass-gate is controllable by the first signal;
    a second pass-gate controllable by third and fourth signals, wherein the fourth signal is a complementary of the third signal, and wherein an n-type transistor of the second pass-gate is controllable by the third signal;
    a third pass-gate controllable by fifth and sixth signals, wherein the sixth signal is a complementary of the fifth signal, and wherein an n-type transistor of the third pass-gate is controllable by the fifth signal;
    a fourth pass-gate controllable by seventh and eighth signals, wherein the eighth signal is complementary of the seventh signal, wherein an n-type transistor of the fourth pass-gate is controllable by the seventh signal, and wherein the first, second, third, and fourth pass-gates are coupled to a node; and
    a network of devices coupled to the node,
        wherein when the network of devices is an n-type network, the network of devices is controllable by the second, the fourth, the sixth, and the eighth signals; or
        wherein when the network of devices is a p-type network, the network of devices is controllable by the first, the third, the fifth, and the seventh signals,
    wherein the network of devices comprises:
        a first transistor coupled to the node;
        a second transistor coupled in series with the first transistor; and
        a combinational logic gate coupled to a gate of the first or second transistor, wherein the first transistor is controllable by the second signal, and wherein the combinational logic is controllable by the fourth, sixth, and eighth signals.

2. The apparatus of claim 1, wherein the network of devices comprises a pull-down network coupled to the node and ground.

3. The apparatus of claim 2, wherein the pull-down network comprises at least three transistors coupled in series between the node and the ground including the first transistor and the second transistor.

4. The apparatus of claim 3, wherein the three transistors are n-type transistors.

5. The apparatus of claim 1, wherein the network of devices comprises a pull-up network coupled to the node and a supply node.

6. The apparatus of claim 5, wherein the pull-up network comprises at least three transistors coupled in series between the node and the supply node, including the first transistor and the second transistor.

7. The apparatus of claim 6, wherein the three transistors are p-type transistors.

8. The apparatus of claim 1 comprises:
    a first inverter coupled to the first pass-gate, wherein the first inverter is to be driven by a first input signal;
    a second inverter coupled to the second pass-gate, wherein the second inverter is to be driven by a second input signal;
    a third inverter coupled to the third pass-gate, wherein the third inverter is to be driven by a third input signal; and
    a fourth inverter coupled to the fourth pass-gate, wherein the fourth inverter is to be driven by a fourth input signal.

9. An apparatus comprising:
    a first inverter controllable by first and second signals, wherein the second signal is a complementary of the first signal;
    a second inverter controllable by third and fourth signals, wherein the fourth signal is a complementary of the third signal;
    a third inverter controllable by fifth and sixth signals, wherein the sixth signal is a complementary of the fifth signal, wherein the first, second, and third inverters are coupled to a node; and
    a network of devices coupled to the node, wherein the network of devices is controllable by at least three of the: first, second, third, fourth, fifth, or sixth signals,
    wherein the network of devices comprises:
        a first transistor coupled to the node;
        a second transistor coupled in series with the first transistor; and
        a combinational logic gate coupled to a gate of the first or second transistor, wherein the first transistor is controllable by the second signal, and wherein the combinational logic is controllable by the fourth and sixth signals.

10. The apparatus of claim 9, wherein the network of devices comprises a pull-down network coupled to the node and ground.

11. The apparatus of claim 10, wherein the pull-down network comprises at least three transistors coupled in series between node and the ground including the first transistor and the second transistor.

12. The apparatus of claim 11, wherein the three transistors are n-type transistors.

13. The apparatus of claim 9, wherein the network of devices comprises a pull-up network coupled to the node and a supply node.

14. The apparatus of claim 13, wherein the pull-up network comprises at least three transistors coupled in series between node and the supply node, including the first transistor and the second transistor.

15. The apparatus of claim 14, wherein the three transistors are p-type transistors.

16. A system comprising:
a memory; and
a processor coupled to the memory, wherein the processor includes a multiplexer which includes:
a first pass-gate controllable by first and second signals, wherein the second signal is a complementary of the first signal, and wherein an n-type transistor of the first pass-gate is controllable by the first signal;
a second pass-gate controllable by third and fourth signals, wherein the fourth signal is a complementary of the third signal, and wherein an n-type transistor of the second pass-gate is controllable by the third signal;
a third pass-gate controllable by fifth and sixth signals, wherein the sixth signal is a complementary of the fifth signal, wherein the first, second, and third pass-gates are coupled to a node, and wherein an n-type transistor of the third pass-gate is controllable by the fifth signal; and
a network of devices coupled to the node,
wherein when the network of devices is an n-type network, the network of devices is controllable by the: second, fourth, and sixth signals; or
wherein when the network of devices is a p-type network, the network of devices is controllable by the: first, third, and fifth signals,
wherein the network of devices comprises:
a first transistor coupled to the node;
a second transistor coupled in series with the first transistor; and
a combinational logic gate coupled to a gate of the first or second transistor, wherein the first transistor is controllable by the second signal, and wherein the combinational logic is controllable by the fourth and sixth signals; and
a wireless interface communicatively coupled to the processor.

17. The system of claim 16, wherein the network of devices comprises one of:
a pull-down network coupled to the node and ground; or
a pull-up network coupled to the node and a power supply node.

* * * * *